(12) United States Patent
Zeng et al.

(10) Patent No.: US 11,726,407 B2
(45) Date of Patent: Aug. 15, 2023

(54) INTEGRATED SUPER-RESOLUTION LASER DIRECT-WRITING DEVICE AND DIRECT-WRITING METHOD

(71) Applicant: Shanghai Institute of Optics And Fine Mechanics, Chinese Academy of Sciences, Shanghai (CN)

(72) Inventors: Aijun Zeng, Shanghai (CN); Tiecheng Liu, Shanghai (CN); Jingpei Hu, Shanghai (CN); Linglin Zhu, Shanghai (CN); Huijie Huang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 273 days.

(21) Appl. No.: 17/420,384

(22) PCT Filed: Dec. 17, 2018

(86) PCT No.: PCT/CN2018/121449
§ 371 (c)(1),
(2) Date: Jul. 1, 2021

(87) PCT Pub. No.: WO2020/113664
PCT Pub. Date: Jun. 11, 2020

(65) Prior Publication Data
US 2022/0091512 A1     Mar. 24, 2022

(30) Foreign Application Priority Data
Dec. 4, 2018   (CN) .......................... 201811473633.9

(51) Int. Cl.
*G03F 7/20* (2006.01)
(52) U.S. Cl.
CPC ................................ *G03F 7/2053* (2013.01)

(58) Field of Classification Search
CPC ............ C23C 16/4412; C23C 18/1619; C23C 18/1628; C23C 18/163; C23C 18/1632;
(Continued)

(56) References Cited

U.S. PATENT DOCUMENTS 7,136,402 B1 * 11/2006 Ohtsuki .................... G02F 1/37
372/6
11,459,608 B2 * 10/2022 Chen .................... C12Q 1/6874
(Continued)

FOREIGN PATENT DOCUMENTS

| CN | 201063094 A | 5/2008 |
|---|---|---|
| CN | 102621823 A | 8/2012 |

(Continued)

*Primary Examiner* — Deoram Persaud
(74) *Attorney, Agent, or Firm* — Mei & Mark LLP; Manni Li

(57) ABSTRACT

Provided are an integrated super-resolution laser direct-writing device and a direct-writing method. The integrated super-resolution laser direct-writing device includes a first continuous laser, a first optical fiber coupler, a mono-mode optical fiber, a second continuous laser, a second optical fiber coupler, a first annular photonic crystal fiber, a bifurcated optical fiber, a lens group, a first dichroic mirror, an LED light source, a lens, a second dichroic mirror, an auto-focusing module, a third dichroic mirror, a third optical fiber coupler, a square-law graded index fiber, a nanometer displacement table, a second lens, a CMOS camera and a control system. According to the present invention, an original large direct-writing device based on a free optical path can achieve optical fibers of key devices and integration of systems and can be better applied to the field of laser direct-writing.

8 Claims, 3 Drawing Sheets

(58) Field of Classification Search
CPC . C23C 18/1642; C23C 18/1676; C23C 18/31; H01L 21/288; H01L 21/67028; H01L 21/67051; H01L 21/67103; H01L 21/6715; H01L 21/68742; G03F 7/2053; G03F 7/70383; G03F 7/70391; G03F 7/704

See application file for complete search history.

(56) References Cited

U.S. PATENT DOCUMENTS

| | | | |
|---|---|---|---|
| 2003/0081192 A1* | 5/2003 | Nishi | G03B 27/72 355/53 |
| 2003/0155527 A1* | 8/2003 | Natori | G01N 21/6458 250/458.1 |
| 2007/0097369 A1* | 5/2007 | Shimada | G01N 21/6456 356/417 |
| 2010/0014156 A1* | 1/2010 | Iketaki | G02B 26/06 359/385 |
| 2011/0310395 A1 | 12/2011 | Tsai et al. | |

FOREIGN PATENT DOCUMENTS

| | | |
|---|---|---|
| CN | 105954832 A | 9/2016 |
| CN | 107096997 A | 8/2017 |
| CN | 108681210 A | 10/2018 |
| CN | 108877844 A | 11/2018 |
| CN | 108899053 A | 11/2018 |

\* cited by examiner

INTEGRATED SUPER-RESOLUTION LASER DIRECT-WRITING DEVICE AND DIRECT-WRITING METHOD

CROSS-REFERENCE TO RELATED APPLICATIONS

The subject application is a U.S. national stage of PCT/CN2018/121449 filed on Dec. 17, 2018, which claims priority on Chinese Patent Application No. CN 201811473633.9 filed on Dec. 4, 2018. The contents and subject matter of the PCT international application and the Chinese priority application are incorporated herein by reference.

TECHNICAL FIELD

The present invention belongs to the technical fields of laser direct-writing and maskless photolithography, in particular to an integrated laser direct-writing device and a direct-writing method based on a far-field optical microscopic technology.

BACKGROUND ART

For a laser direct-writing method based on a far-field optical microscopic technology, the carving and writing resolution is limited by an Abbe diffraction limit, and the minimum carving and writing size is about half a wavelength. By introducing inducing light and vortex inhibiting light, the diffraction limit can be broken, so that the size is further reduced, and the carving and writing resolution is increased. At present, an existing super-resolution laser direct-writing technology is established by adopting a free optical path to result in incapability of realizing optical fibers of key devices and integration of systems.

SUMMARY OF THE INVENTION

The purpose of the present invention is to provide an integrated super-resolution laser direct-writing device and a direct-writing method, by which the problem that an existing super-resolution laser direct-writing sample machine cannot achieve optical fibers of key devices and integration of systems is solved, and the device and the method have great application values in the fields of laser direct-writing and maskless photolithography.

In order to achieve the above-mentioned purpose, a technical solution of the present invention is described as follows:

an integrated super-resolution laser direct-writing device, characterized by comprising a first continuous laser (1), a first optical fiber coupler (2), a mono-mode optical fiber (3), a second continuous laser (4), a second optical fiber coupler (5), a first annular photonic crystal fiber (6), a bifurcated optical fiber (7), a lens group (8), a first dichroic mirror (9), an LED light source (10), a lens (11), a second dichroic mirror (12), an auto-focusing module (13), a third dichroic mirror (14), a third optical fiber coupler (15), a square-law graded index fiber (16), a nanometer displacement table (17), a second lens (18), a CMOS camera (19) and a control system (20);

The control system is composed of a computer and a field-programmable gate array (hereinafter referred to as FPGA).

The laser output by the first continuous laser (1) is being input to the mono-mode optical fiber (3) through the first optical fiber coupler (2) and being used as a central inducing light; laser output by the second continuous laser (4) is being input to the first annular photonic crystal fiber (6) through the second optical fiber coupler (5) and being used as a peripheral vortex inhibiting light; and a light beam is obtained after the peripheral vortex inhibiting light and the central inducing light are combined by the bifurcated optical fiber (7) being incident to the first dichroic mirror (9) after being expanded by the lens group (8), being reflected by the first dichroic mirror (9), being then incident to the third optical fiber coupler (15) after being sequentially transmitted by the second dichroic mirror (12) and the third dichroic mirror (14), and being irradiated on a sample after sequentially passing through the third optical fiber coupler (15) and the square-law graded index fiber (16);

a light beam emitted by the LED light source (10) is being incident to the second dichroic mirror (12) after being expanded by the lens (11), being reflected by the second dichroic mirror (12), being incident to the square-law graded index fiber (16) to irradiate the sample after sequentially passing through the third dichroic mirror (14) and the third optical fiber coupler (15), being reflected by the sample to return along an original optical path, being incident to the second dichroic mirror (12) after sequentially passing through the square-law graded index fiber (16), the third optical fiber coupler (15) and the third dichroic mirror (14), being incident to the second lens (18) after being sequentially transmitted by the second dichroic mirror (12) and the first dichroic mirror (9), being incident to the CMOS camera (19) after being focused by the second lens (18), and being imaged by the CMOS camera (19);

an eccentric light beam emitted by the auto-focusing module (13) is entering the square-law graded index fiber (16) through the optical fiber coupler (15) to irradiate the sample after being reflected by the third dichroic mirror (14), returning along the original optical path after being reflected by the sample, being incident to the third dichroic mirror (14) sequentially through the square-law graded index fiber (16) and the third optical fiber coupler (15), being then incident to the second lens (18) after being sequentially transmitted by the third dichroic mirror (14), the second dichroic mirror (12) and the first dichroic mirror (9), being incident to the CMOS camera (19) after being focused by the second lens (18), and being imaged by the CMOS camera (19); and the control system (20) is being respectively connected with control ends of the first continuous laser (1), the second continuous laser (4), the LED light source (10), the auto-focusing module (13) and the nanometer displacement table (17), and the control system (20) being connected with an output end of the CMOS camera (19).

The lens group comprises a pair of positive and negative lenses and is used for expanding a light beam.

The sample comprises a photoresist material and a substrate sequentially from top to bottom.

The photoresist material is a photopolymerizable material as well as a corresponding photo-initiator and photo-inhibitor.

The photopolymerizable material is pentaerythritol pentaacrylate, dipentaerythritol pentaacrylate or triethylene glycol dimethacrylate, the photo-initiator is Michler's ketone, camphorquinone or ethyl 4-dimethylaminobenzoate, and the inhibitor is tetraethylthiuram disulfide.

The laser direct-writing method in which the integrated super-resolution laser direct-writing device is utilized includes the steps of:

1) pretreating the sample: adding a certain amount of photo-initiator and photo-inhibitor into the photopolymerizable material, and performing uniform mixing;

2) placing the sample on the nanometer displacement table, outputting, by the control system, an instruction to switch on a laser of the auto-focusing module, enabling an emergent light to be irradiated on the sample through an optical path, focusing a light beam reflected by the sample on the CMOS camera, and realizing auto-focusing by virtue of a defocusing determination module of the computer;

3) controlling, by the control system, the nanometer displacement table to move to make a to be carved and written area on a plane of the sample move to an initial recording point, controlling, by the control system, the second continuous laser to be switched on, forming a vortex light from output laser through the second optical fiber coupler and the first annular photonic crystal fiber, and exciting the photo-inhibitor outside a d/2 range of the center of the vortex light in a recoding point area on the plane of the sample to inhibit the polymerization of the photopolymerizable material; and controlling, by the control system, the first continuous laser to be switched on, and forming the central inducing light from output laser through the first optical fiber coupler and the mono-mode optical fiber to induce the photo-initiator within the d/2 range of the center of the vortex light in the recording point area and initiate the polymerization of the photopolymerizable material; and after the carving and writing time reaches 400 ms to 700 ms, entering step 4); and 4) controlling, by the control system, the first continuous laser and the second continuous laser to be switched off, and controlling the nanometer displacement table to move to make the to be carved and written area on the plane of the sample move to the next recording point until all points in the to be carved and written area on the plane of the sample are carved and written completely, wherein the carving and writing time reaches 400 ms to 700 ms.

The steps 2) to 3) further include a sample appearance determination step which specifically includes: outputting, by the control system, an instruction to switch on the LED light source, enabling an emergent light to be irradiated on the sample through an optical path, focusing a light beam reflected by the sample on the CMOS camera so as to be imaged, observing the appearance of the sample by virtue of corresponding software on the computer, when the appearance of the sample does not meet a demand, returning to the step 1), or else, entering the step 3).

Compared with the prior art, the present invention has the technical effects described as follows:

the problem that a super-resolution laser direct-writing principled sample machine can be only established by adopting a free optical path in a laboratory to result in incapability of achieving optical fibers of key devices and integration of systems is solved, and the device and the method have great application values in the fields of laser direct-writing and maskless photolithography.

DETAILED DESCRIPTION OF THE INVENTION

The present invention will be further described below with reference to embodiments and accompanying drawings, however, they should not limit the protective scope of the present invention.

Figure 1:
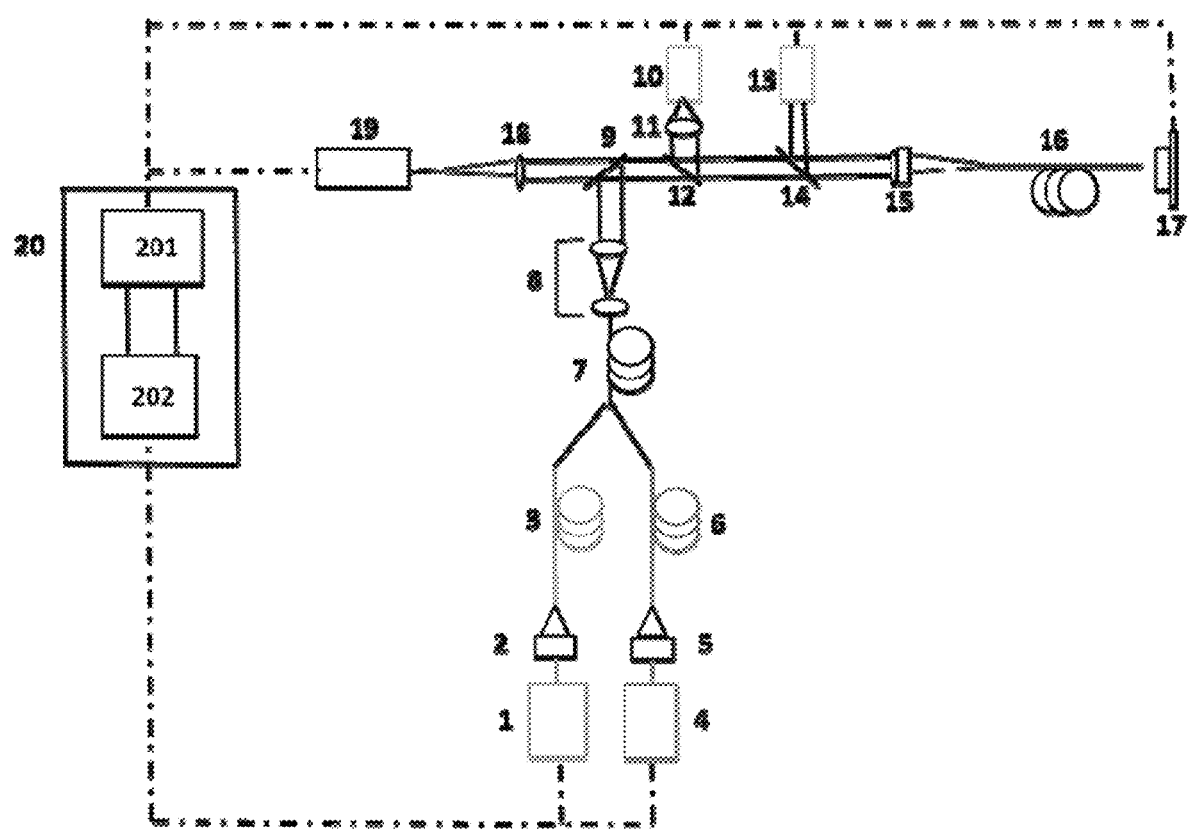
FIG. 1 is a diagram showing an optical path of an integrated super-resolution laser direct-writing device provided by the present invention.

Firstly, reference is made to FIG. 1 which is a diagram showing an optical path of an integrated super-resolution laser direct-writing device. As can be seen from the figure, the integrated device includes a first continuous laser 1, a first optical fiber coupler 2, a mono-mode optical fiber 3, a second continuous laser 4, a second optical fiber coupler 5, a first annular photonic crystal fiber 6, a bifurcated optical fiber 7, a lens group 8, a first dichroic mirror 9, an LED light source 10, a lens 11, a second dichroic mirror 12, an auto-focusing module 13, a third dichroic mirror 14, a third optical fiber coupler 15, a square-law graded index fiber 16, a nanometer displacement table 17, a second lens 18, a CMOS camera 19 and a control system 20.

The control system 20 is composed of a computer 201 and a field-programmable gate array (hereinafter referred to as FPGA).

Laser output by the first continuous laser 1 is input to the mono-mode optical fiber 3 through the first optical fiber coupler 2 and is used as a central inducing light; laser output by the second continuous laser 4 is input to the first annular photonic crystal fiber 6 through the second optical fiber coupler 5 and is used as a peripheral vortex inhibiting light; and a light beam obtained after the peripheral vortex inhibiting light and the central inducing light are combined by the bifurcated optical fiber 7 is incident to the first dichroic mirror 9 after being expanded by the lens group 8, is reflected by the first dichroic mirror 9, is then incident to the third optical fiber coupler 15 after being sequentially transmitted by the second dichroic mirror 12 and the third dichroic mirror 14, and is irradiated on a sample after sequentially passing through the third optical fiber coupler 15 and the square-law graded index fiber 16;

a light beam emitted by the LED light source 10 is incident to the second dichroic mirror 12 after being expanded by the lens 11, is reflected by the second dichroic mirror 12, is incident to the square-law graded index fiber 16 to irradiate the sample after sequentially passing through the third dichroic mirror 14 and the third optical fiber coupler 15, is reflected by the sample to return along an original optical path, is incident to the second dichroic mirror 12 after sequentially passing through the square-law graded index fiber 16, the third optical fiber coupler 15 and the third dichroic mirror 14, is incident to the second lens 18 after being sequentially transmitted by the second dichroic mirror 12 and the first dichroic mirror 9, is incident to the CMOS camera 19 after being focused by the second lens 18, and is imaged by the CMOS camera 19;

an eccentric light beam emitted by the auto-focusing module 13 enters the square-law graded index fiber 16 through the optical fiber coupler 15 to irradiate the sample after being reflected by the third dichroic mirror 14, returns along the original optical path after being reflected by the sample, is incident to the third dichroic mirror 14 sequentially through the square-law graded index fiber 16 and the third optical fiber coupler 15, is then incident to the second lens 18 after being sequentially transmitted by the third dichroic mirror 14, the second dichroic mirror 12 and the first dichroic mirror 9, is incident to the CMOS camera 19 after being focused by the second lens 18, and is imaged by the CMOS camera 19; and the control system 20 is respectively connected with control ends of the first continuous laser 1, the second continuous laser 4, the LED light source 10, the auto-focusing module 13 and the nanometer displacement table 17, and the control system 20 is connected with an output end of the CMOS camera 19.

The lens group 8 comprises a pair of positive and negative lenses and is used for expanding a light beam.

The sample comprises a photoresist material and a substrate sequentially from top to bottom.

The photoresist material is a photopolymerizable material as well as a corresponding photo-initiator and photo-inhibitor.

The photopolymerizable material is pentaerythritol pentaacrylate, dipentaerythritol pentaacrylate or triethylene glycol dimethacrylate, the photo-initiator is Michler's ketone, camphorquinone or ethyl 4-dimethylaminobenzoate, and the inhibitor is tetraethylthiuram disulfide.

For different photoresist materials, the selected photo-initiators and photo-inhibitors are different, and parameters of the adopted first continuous laser 1 and second continuous laser 4 are also different.

Figure 2:
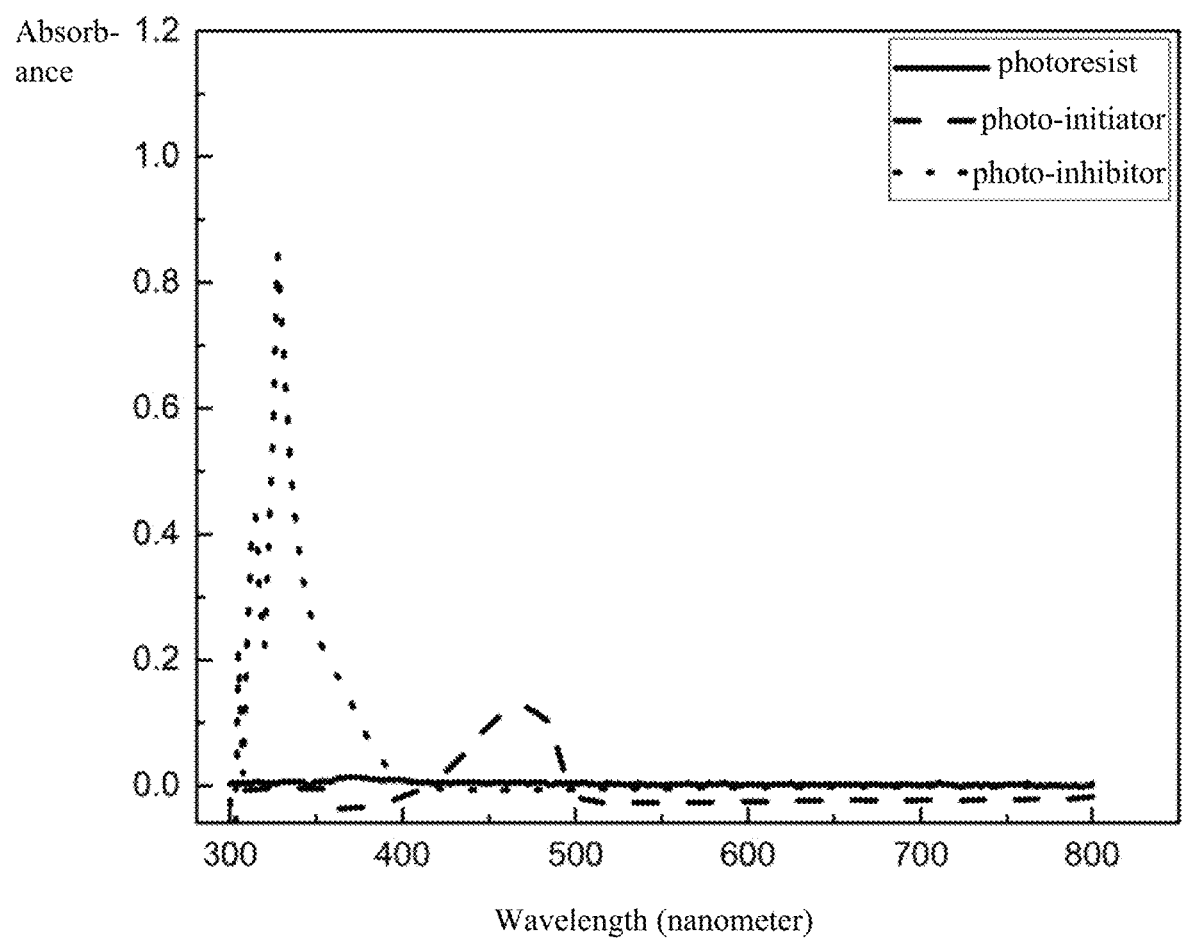
FIG. 2 is a diagram showing absorption spectrums of a photoresist material, a photo-initiator and a photo-inhibitor.

FIG. 2 is a diagram showing absorption spectrums of a photoresist, a photo-initiator and a photo-inhibitor. As can be seen from the figure, the photoresist has no absorption peaks at 300 nm to 800 nm, an absorption peak of the photo-initiator is located at 460 nm, and an absorption peak of the photo-inhibitor is located at 350 nm. The photo-initiator absorbs laser energy at 460 nm so that a chemical bond of the initiator is broken to induce a photoresist monomer to generate a polymerization reaction; and the photo-inhibitor absorbs laser energy at 350 nm so that a chemical bond of the inhibitor is broken to be combined with a chemical bond of the photoresist to inhibit the polymerization of the photoresist monomer itself. Therefore, by applying such features, carving and writing are realized in manners of central laser induction and peripheral hollow light inhibition. That is, a wavelength of a first continuous laser is selected to be 460 nm, and a wavelength of the second continuous laser is selected to be 350 nm.

Figure 3:
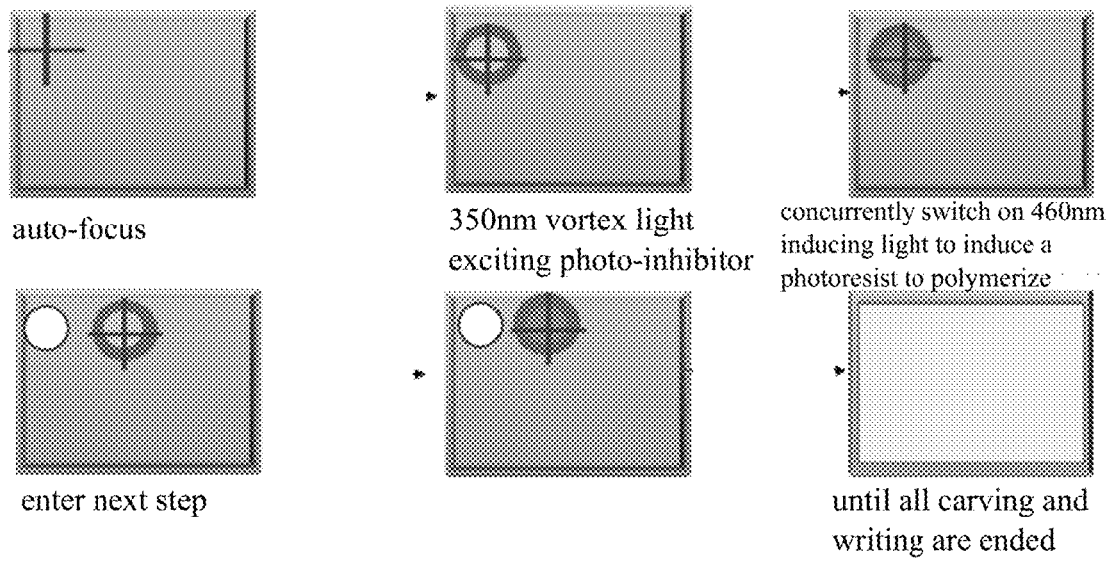
FIG. 3 is a schematic diagram showing steps of a direct-writing method of an integrated super-resolution laser direct-writing device according to an embodiment of the present invention.

FIG. 3 is a schematic diagram showing steps of a direct-writing method of an integrated super-resolution laser direct-writing device according to an embodiment of the present invention. The method is described in detail in embodiment 1.

EMBODIMENT 1

With reference to a photoresist triethylene glycol dimethacrylate, the photoresist has no absorption peaks at 300 nm to 800 nm, an absorption peak of a photo-initiator camphorquinone is located at 460 nm, an absorption peak of a photo-inhibitor tetraethylthiuram disulfide is located at 350 nm, that is, a wavelength of a first continuous laser is designed to be 460 nm, and a wavelength of a second continuous laser is designed to be 350 nm.

1) The sample is pretreated: a certain amount of photo-initiator and photo-inhibitor are added into the photopolymerizable material are uniformly mixed;

2) the sample is placed on the nanometer displacement table 17, the control system 20 outputs an instruction to switch on a laser of the auto-focusing module 13, an emergent light is irradiated on the sample through an optical path, a light beam reflected by the sample is focused on the CMOS camera 19, and auto-focusing is realized by virtue of a defocusing determination module of the computer 201;

3) the control system 20 controls the nanometer displacement table 17 to move to make a to be carved and written area on a plane of the sample move to an initial recording point, the control system 20 controls a 350 nm laser 4 to be switched on, a vortex light is formed from output laser through the second optical fiber coupler 5 and the first annular photonic crystal fiber 6, and tetraethylthiuram disulfide outside a d/2 range of the center of the vortex light in a recoding point area on the plane of the sample is excited to result in chemical bond breaking to inhibit a polymerization reaction of triethylene glycol dimethacrylate; and the control system 20 controls a 460 nm first continuous laser 1 to be switched on, and a central inducing light is formed from output laser through the first optical fiber coupler 2 and the mono-mode optical fiber 3 to induce the camphorquinone within the d/2 range of the center of the vortex light in the recording point area and induce a polymerization reaction of triethylene glycol dimethacrylate; and after the carving and writing time reaches 400 ms to 700 ms, step 4) is performed; and 4) the control system 20 controls the 350 nm first continuous laser 1 and the 460 nm second continuous laser 4 to be switched off, and controls the nanometer displacement table 17 to move to make the to be carved and written area on the plane of the sample move to the next recording point until all points in the to be carved and written area on the plane of the sample are carved and written completely, wherein the carving and writing time reaches 400 ms to 700 ms.

The laser direct-writing method in which the integrated super-resolution laser direct-writing device of the present invention is utilized is characterized in that the steps 2) to 3) further include a sample appearance determination step which specifically includes that: the control system 20 outputs an instruction to switch on the LED light source 10, an emergent light is irradiated on the sample through an optical path, a light beam reflected by the sample is focused on the CMOS camera 19 so as to be imaged, the appearance of the sample is observed by virtue of corresponding software on the computer 201, when the appearance of the sample does not meet a demand, the step 1) is returned, or else, the step 3) is performed.

We claim:
1. An integrated super-resolution laser direct-writing device, comprising
  a first continuous laser (1),
  a first optical fiber coupler (2),
  a mono-mode optical fiber (3),
  a second continuous laser (4),
  a second optical fiber coupler (5),
  a first annular photonic crystal fiber (6),
  a bifurcated optical fiber (7),
  a lens group (8),
  a first dichroic mirror (9),
  an LED light source (10),
  a lens (11),
  a second dichroic mirror (12),
  an auto-focusing module (13),
  a third dichroic mirror (14),
  a third optical fiber coupler (15),
  a square-law graded index fiber (16),
  a nanometer displacement table (17),
  a second lens (18), a CMOS camera (19), and
a control system (20),
wherein an laser output by the first continuous laser (1) is input to the mono-mode optical fiber (3) through the first optical fiber coupler (2) and being used as a central inducing light;
an laser output by the second continuous laser (4) is input to the first annular photonic crystal fiber (6) through the second optical fiber coupler (5) and being used as a peripheral vortex inhibiting light;
the peripheral vortex inhibiting light and the central inducing light are combined by the bifurcated optical fiber (7) to obtain a light beam, the light beam is expanded by the lens group (8) and becomes incident to the first dichroic mirror (9), then, the light beam is reflected by the first dichroic mirror (9), sequentially transmitted by the second dichroic mirror (12) and the third dichroic mirror (14), and becomes incident to the third optical fiber coupler (15), and after sequentially passing through the third optical fiber coupler (15) and the square-law graded index fiber (16), is irradiated on a sample;
a light beam emitted by the LED light source (10) is incident to the second dichroic mirror (12) after being expanded by the lens (11), reflected by the second dichroic mirror (12), sequentially passes through the third dichroic mirror (14) and the third optical fiber coupler (15), and becomes incident to the square-law graded index fiber (16) to irradiate the sample, then, the light beam is reflected by the sample, and the reflected light beam returns along an original optical path, sequentially passing through the square-law graded index fiber (16), the third optical fiber coupler (15) and the third dichroic mirror (14), is incident to the second dichroic mirror (12), sequentially transmitted by the second dichroic mirror (12) and the first dichroic mirror (9) and becomes incident to the second lens (18), is focused by the second lens (18) and becomes incident to the CMOS camera (19) and imaged by the CMOS camera (19);
an eccentric light beam emitted by the auto-focusing module (13) enters the square-law graded index fiber (16) through the optical fiber coupler (15) to irradiate the sample after being reflected by the third dichroic mirror (14), returns along the original optical path after being reflected by the sample, becomes incident to the third dichroic mirror (14) after sequentially through the square-law graded index fiber (16) and the third optical fiber coupler (15), then becomes incident to the second lens (18) after sequentially transmitted by the third dichroic mirror (14), the second dichroic mirror (12), and the first dichroic mirror (9), becomes incident to the CMOS camera (19) after being focused by the second lens (18), and is imaged by the CMOS camera (19); and
the control system (20) is respectively connected with control ends of the first continuous laser (1), the second continuous laser (4), the LED light source (10), the auto-focusing module (13) and the nanometer displacement table (17), and the control system (20) is connected with an output end of the CMOS camera (19).

2. The integrated super-resolution laser direct-writing device of claim 1, wherein the control system (20) comprises a computer (201) and a field-programmable gate array (202).

3. The integrated super-resolution laser direct-writing device of claim 1, wherein the lens group (8) comprises a pair of positive and negative lenses, and the lens group (8) is used for expanding a light beam.

4. The integrated super-resolution laser direct-writing device of claim 1, wherein the sample comprises a photoresist material and a substrate sequentially from top to bottom.

5. The integrated super-resolution laser direct-writing device of claim 4, wherein the photoresist material is a photopolymerizable material and a corresponding photo-initiator and photo-inhibitor.

6. The integrated super-resolution laser direct-writing device of claim 5, wherein the photopolymerizable material is pentaerythritol pentaacrylate, dipentaerythritol pentaacrylate or triethylene glycol dimethacrylate, the photo-initiator is Michler's ketone, camphorquinone or ethyl 4-dimethylaminobenzoate, and the inhibitor is tetraethylthiuram disulfide.

7. A laser direct-writing method using the integrated super-resolution laser direct-writing device of claim 1, comprising:
1) pretreating the sample: adding a certain amount of photo-initiator and photo-inhibitor into the photopolymerizable material, and performing uniform mixing;
2) placing the sample on the nanometer displacement table (17), outputting, by the control system (20), an instruction to switch on a laser of the auto-focusing module (13), enabling an emergent light to be irradiated on the sample through an optical path, focusing a light beam reflected by the sample on the CMOS camera (19), and realizing auto-focusing by virtue of a defocusing determination module of the computer (201);
3) controlling, by the control system (20), the nanometer displacement table (17) to move to make a to be carved and written area on a plane of the sample move to an initial recording point, controlling, by the control system (20), the second continuous laser (4) to be switched on, forming a vortex light from output laser through the second optical fiber coupler (5) and the first annular photonic crystal fiber (6), and exciting the photo-inhibitor outside a d/2 range of the center of the vortex light in a recoding point area on the plane of the sample to inhibit the polymerization of the photopolymerizable material; and controlling, by the control system (20), the first continuous laser (1) to be switched on, and forming the central inducing light from output laser through the first optical fiber coupler (2) and the mono-mode optical fiber (3) to induce the photo-initiator within the d/2 range of the center of the vortex light in the recording point area and initiate the polymerization of the photopolymerizable material; and after the carving and writing time reaches 400 ms to 700 ms, entering step 4); and
4) controlling, by the control system (20), the first continuous laser (1) and the second continuous laser (4) to be switched off, and controlling the nanometer displacement table (17) to move to make the to be carved and written area on the plane of the sample move to the next recording point until all points in the to be carved and written area on the plane of the sample are carved and written completely, wherein the carving and writing time reaches 400 ms to 700 ms.

8. The laser direct-writing method according to claim 7, further comprising
determining sample appearance after step 2) and prior to step 3), wherein the control system (20) outputs an instruction to switch on the LED light source (10), an emergent light is irradiated on the sample through an optical path, a light beam reflected by the sample is focused on the CMOS camera (19) so as to be imaged, the appearance of the sample is observed by virtue of corresponding software on the computer (201), when the appearance of the sample does not meet a demand, return to step 1), or else, perform step 3).

\* \* \* \* \*